United States Patent [19]

Wittlinger et al.

[11] 4,044,313

[45] Aug. 23, 1977

[54] PROTECTIVE NETWORK FOR AN INSULATED-GATE FIELD-EFFECT (IGFET) DIFFERENTIAL AMPLIFIER

[75] Inventors: Harold Allen Wittlinger, Pennington, N.J.; Michael Scott Fisher, Farmers Branch, Tex.

[73] Assignee: RCA Corporation, New York, N.Y.

[21] Appl. No.: 746,214

[22] Filed: Dec. 1, 1976

[51] Int. Cl.[2] .......................... H03F 3/45; H02H 3/20
[52] U.S. Cl. ............................ 330/207 P; 330/30 D; 330/35; 330/38 M; 361/56; 361/91
[58] Field of Search ................... 330/30 D, 35, 38 M, 330/207 P; 307/304; 357/41; 361/56, 91

[56] References Cited

U.S. PATENT DOCUMENTS 3,879,640  4/1975  Schade .......................... 307/304 X Primary Examiner—James B. Mullins
Attorney, Agent, or Firm—H Chistoffersen; Henry I. Schanzer

[57] ABSTRACT

The input stage of an amplifier includes two input terminals to which are connected the gates of two, differentially connected, IGFETs protected by two diodes connected back-to-back (in series) between the gates. The amplifier also includes means for applying an external signal source to one input terminal, means for shorting the diode connected to the other input terminal, and means for negatively feeding back the output of the amplifier to its input. This maintains the potential difference across the diode connected to the input terminal to which the external signal source is connected close to zero volt thereby substantially eliminating any leakage current through it.

8 Claims, 5 Drawing Figures

PROTECTIVE NETWORK FOR AN INSULATED-GATE FIELD-EFFECT (IGFET) DIFFERENTIAL AMPLIFIER

The present invention relates to a protective network for insulated-gate field-effect devices.

Insulated gate devices and, specifically, insulated-gate field-effect transistors (IGFETs) and subject to permanent damage if the voltage applied across the insulator of the IGFET exceeds the rupture potential of the insulator. It has also been observed that the transfer characteristics of IGFETs often change even when their gate-to-source regions are stressed by potentials which are considerably below the rupture potential of the insulator. This is undesirable, especially in linear circuits such as differential input amplifiers where the transistors forming the differential section must be closely matched. Therefore, protective networks are needed to prevent potential differentials greater than a predetermined level from being applied across the insulator or between selected electrodes of IGFETs.

A known circuit for protecting two IGFETs interconnected to form a differential amplifier input stage is described in U.S. Pat. No. 3,879,640, issued to O. H. Schade, and assigned to the assignee of this application. The patented circuit includes two diodes connected back-to-back between the gates of the IGFETs for electrostatic and overvoltage protection. However, a problem exists with the diode network in that the diodes, although designed and processed very carefully, pass a leakage current into or from the gates which are connected to the input terminals of the amplifier. Even though the leakage current may be very small, there are many applications such as smoke detectors, timing circuits, sample and hold circuit, and high impedance instruments, in which it is desirable and/or necessary to have extremely low leakage currents (i.e., the input impedance to the amplifier should be extremely high).

The present invention resides, in part, in the recognition that where two back-to-back diodes are used to protect IGFETs interconnected to form a differential amplifier input stage, one of the diodes may be short circuited to enable the application of approximately zero potential differential across the other one of the two diodes to which a signal source may be connected. Applying substantially zero potential differential across a diode substantially eliminates the flow of leakage current through it.

The invention also resides in the protective network for the differential amplifier stage comprising two IGFETs. The network includes a first region of first conductivity type in which at least two regions of second conductivity are diffused for forming two PN junctions having high back impedances. Each one of the two regions is connected to a different one of the two gates of the IGFETs. A conductive contact is made the to the first region for enabling the connection of the first region to a selected one of the two gates for shorting out the PN junction connected to the gate.

The invention also resides in the means for connecting a signal source to one input terminal of the amplifier and the means for maintaining the potential differential across the diode connected to the one input terminal at approximately zero volts.

In the accompanying drawing, like reference characters denote like components, and;

Figure 1:
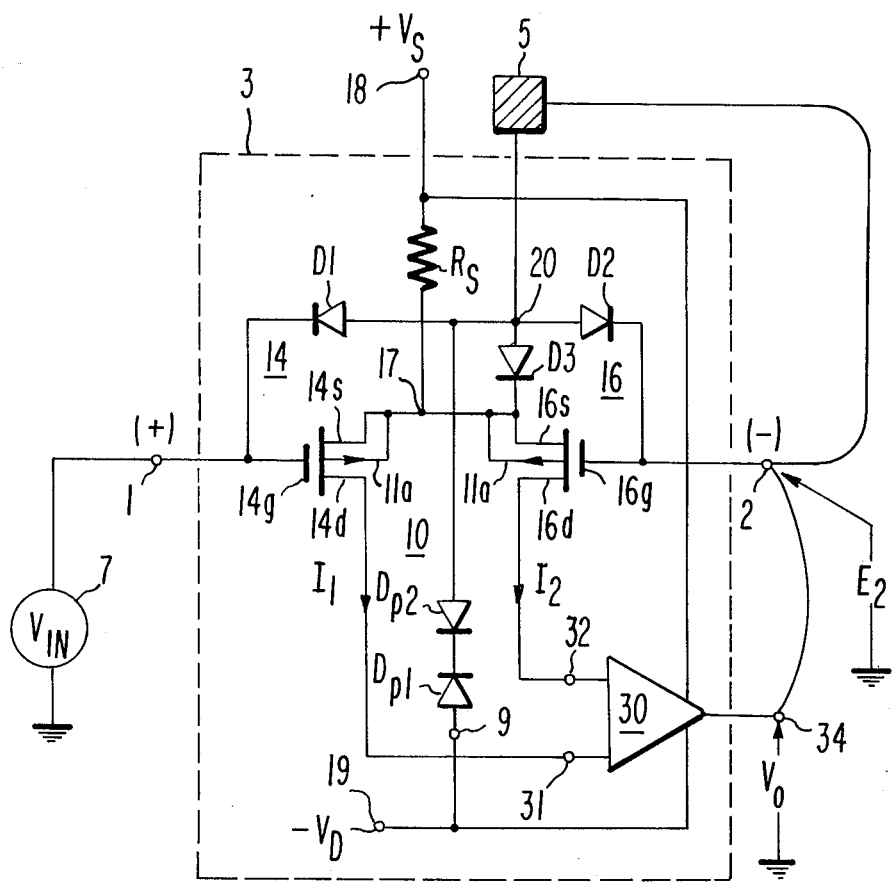
FIG. 1 is a schematic diagram of a circuit embodying the invention.

The circuit of FIG. 1 includes an amplifier 3, shown within a dotted line box, whose input stage 10 includes IGFETs 14 and 16 connected at their gates 14g and 16g, respectively, to non-inverting (+) input terminal 1 and to inverting (−) input terminal 2, respectively. The source electrodes 14s and 16s and the substrates 11a of transistors 14 and 16 are connected to node 17 to which is connected one end of a resistor Rs. The other end of resistor Rs is connected to power terminal 18 to which is applied the most positive operating voltage $+V_S$ volts. Rs could of course be replaced by a current source. The drain electrodes 14d and 16d of transistors 14 and 16, respectively, are connected to input terminals 31 and 32, respectively, of amplifying means 30. Means 30 is connected between terminal 18 and power terminal 19 to which is applied the most negative operating voltage $-V_D$ volts. Amplifying means 30 has an output terminal 34 at which is produced an output voltage ($V_O$) which is responsive to the differential signal applied between its two inputs. $V_O$ may be expressed in terms of the currents at its inputs as $V_0 = K_1 (I_2 - I_1)$ where $K_1$ is a constant, $I_1$ is the current between drain 14d and input terminal 31, and $I_2$ is the current between drain 16d and input terminal 32.

Amplifying means 30, as shown in an amplifier denoted the CA3130 presently being manufactured by RCA Corporation, may comprise a current mirror in combination with a second voltage amplifying stage in addition to the input stage and an output stage. Alternatively, means 30 may be any one of a number of well known amplifying circuits capable of providing signal gain. $V_0$ may be also expressed in terms of the potentials $V_{IN}$ and $E_2$ at terminals 1 and 2, respectively, as $V_0 = A_{OL}(V_{IN} - E_2)$, where $A_{OL}$ is the open loop gain of the amplifier 3 and may have any value over an extremely wide range of values. In circuits embodying the invention, there is a preferred lower limit on $A_{OL}$ because $A_{OL}$ controls the amount of offset error between the input terminals when the output is negatively fed back to the input.

Transistors 14 and 16 are protected against electrostatic stresses and overvoltages by a diode network comprising diodes D1 and D2 connected at their cathodes to gates 14g and 16g, respectively, and diode D3 connected at its cathode to the sources and substrates of transistors 14 and 16.

As discussed below, a parasitic leakage path is formed concurrently with the formation of the protection diodes in most bulk silicon integrated circuits suitable for the manufacture of IGFETs for linear circuit applications.

The anodes of diodes D1, D2, and D3 share a common region 20 with which there is associated the parasitic leakage path. The leakage path includes a diode, $D_{P2}$, connected at its anode to region 20 and a leaky, low back impedance, diode $D_{P1}$ connected at its cathode to the cathode of diode $D_{P2}$. The most negative circuit potential $-V_D$ volts is applied to the anode 9 of diode $D_{P1}$. Consequently, diode $D_{P1}$ is normally reverse biased and diode $D_{P2}$ is normally forward biased. The potential or signal level applied to the cathodes of diodes D1, D2 or D3 is normally more positive than the potential established within region 20 which tends to be close to $-V_D$ volts.

The protective diodes are, therefore, normally reverse biased throughout the linear and useful range of operation. (Where the circuit is made with discrete components separate means would be provided to keep the diodes reverse biased in the normal range of operation). Each protective diode provides a relatively high impedance path in series with the lower impedance leakage path of diodes $D_{P1}$, $D_{P2}$ and effectively isolates the parasitic leakage path from the electrodes or nodes being protected.

The protection circuit so far described is schematically similar to that described in U.S. Pat. No. 3,879,640.

To match the extremely high input impedance of the IGFETs, the protective diodes D1, D2 and D3 are especially designed to have minimum leakage currents, under reverse bias conditions, in the range of picoamperes ($10^{-12}$ amperes). However, since these diodes are normally reverse biased, leakage currents can flow from signal sources connected to terminals 1 and 2 through diodes D1 and D2. Although the leakage currents drawn from the input terminals or supplied into the input terminals are small, the circuit operation may be significantly and deleteriously affected and in some applications even this low leakage is not tolerable. This becomes evident when it is realized that the input impedance of an IGFET may be $10^{15}$ ohms or higher. However, a diode connected to the gate of IGFET even if it permits leakage currents in the picoampere range reduces the effective input impedance of the IGFET amplifier to the range of $10^{12}$ ohms. This may be a high impedance in some applications. But, as a rule, it diminishes and in some instances negates the benefits associated with the extremely high input impedance of the IGFET input stage.

However, the protection diode network although it causes leakage current to flow at the amplifier inputs is absolutely necessary to protect the IGFETs during handling and assembly. It prevents the potential between the gates of the transistors and between the gates and the common source region from exceeding $|V_R + V_F|$ volts where the diodes are assumed to have equal breakdown (reverse) voltages, $V_R$, and equal forward drops, $V_F$.

The circuit of FIG. 1 includes means for reducing, substantially, the leakage current flow through the protective diodes with no reduction in the protection of the gate insulators against electrostatic and overvoltage stresses.

The node 20 common to the anodes of diodes D1, D2 and D3 is connected via negligible impedance means to a bond pad 5. Bond pad 5 may be connected via a very low, or negligible, impedance means to either input terminal 1 to short out diode D1 or alternatively to input terminal 2 to short out diode D2.

In FIG. 1, bond pad 5 is connected to inverting terminal 2. This shorts out diode D2 and makes a low (or negligible) impedance connection between terminal 2 and the anode of diode D1. A signal source 7 is connected to input terminal 1 and applies to it a signal $V_{IN}$ which normally varies between $+V_S$ volts and $-V_D$ volts. The output 34 is connected by direct coupling means to terminal 2. This closes the loop around the amplifier 3 providing the maximum negative feedback between the output and the input of the amplifier.

With $V_0$ at the output 34 fed back directly to terminal 2, amplifier 3 functions as a voltage follower and the potential produced at input 2 ($E_2$) is substantially equal to $V_{IN}$. That is, $V_0$ and $E_2$ follow $V_{IN}$ throughout the linear operating range of the amplifier. For example, if $V_{IN}$ goes lower than $E_2$, the current $I_1$ (and the voltage) produced at the drain of transistor 14 increases while $I_2$ (and the voltage) produced at the drain of transistor 16 decreases. The differential signal causes $V_0$ to go more negative. $V_O$ directly fed back to the gate of transistor 16, causes $I_2$ to increase until it is almost equal to $I_1$. Equilibrium occurs when $E_2$ is approximately equal to $V_{IN}$.

In all differential operational amplifier configurations with negative feedback, the input difference voltage approaches zero. However, there must exist a small error between the input terminals to drive the output to produce its defined levels. The error is a function of the open loop gain ($A_{OL}$) of the amplifier. Assume the $A_{OL}$ of amplifier 3 to be 400,000. Assume also that $+V_S = +10$ volts and $-V_D = -10$ volts and the $V_0$ can swing between $+10$ volts and $-10$ volts for a total swing of 20 volts. Since the $A_{OL}$ of the amplifier is 400,000, A voltage difference between the inputs of 20 volts/400,000 or 50 $\times$ $10^{-6}$ volt will cause the output of the amplifier to swing 20 volts.

The relationship between $V_O$ and $V_{IN}$ for the closed loop non-inverting amplifier configuration of FIG. 1 may be expressed as follows:

$$\frac{V_O}{V_{IN}} = \frac{A_{OL}}{(A_{OL})(B) + 1} \qquad \text{eq. 1}$$

Where B is the feedback ratio which for the circuit of FIG. 1 is equal to 1. For an assumed $A_{OL}$ of 400,000, the voltage $E_2$ at terminal 2 may then be expressed in terms of $V_{IN}$, as follows:

$$E_2 = V_O = V_{IN} \times \frac{400,000}{400,00} \cong V_{IN} \times 0.9999975 \qquad \text{eq. 2}$$

For $V_{IN} = 20v$, $E_2 = V_O = 19.99995$ volts. The difference between $V_{IN}$ and $E_2$ which is also the reverse bias across diode D1 is then 0.00005 volts (0.05 $\times$ $10^{-13}$ volts)

Figure 2:
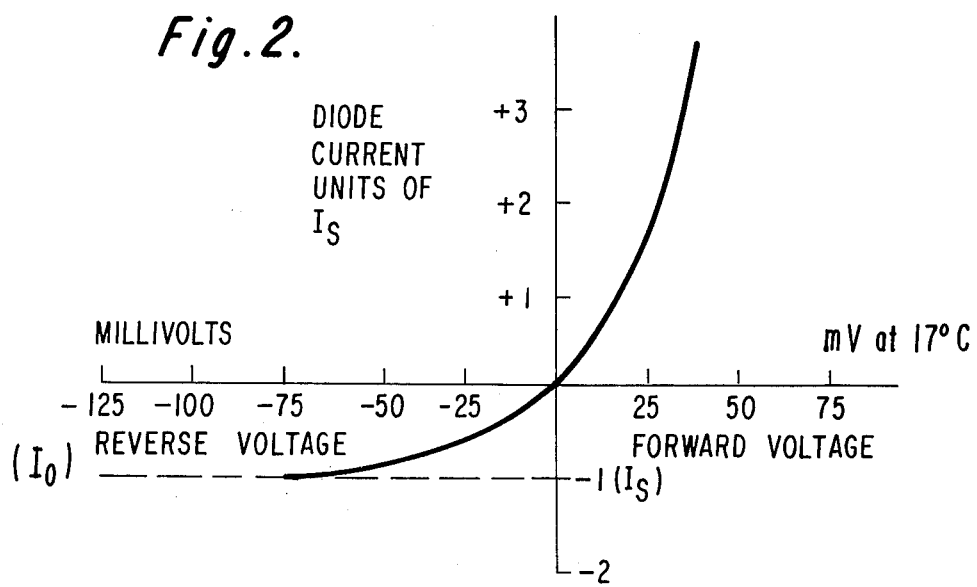
FIG. 2 is a drawing of the idealized current voltage (I-V) characteristic of a typical diode.

Therefore, with the feedback loop closed (and neglecting mismatching offsets between the input transistors) the maximum difference between $V_{IN}$ and $E_2$ is 0.05 millivolts. This is the value of the reverse bias applied across diode D1. For such an extremely small value of reverse bias there is substantially no leakage current flow across diode D1 and the input impedance of the amplifier approaches the extremely high value possible when using IGFETs. This is best understood by referring to FIG. 2 which shows the current-voltage characteristic of a typical diode.

Under reverse bias conditions of a volt, or so, the diode leakage current ($I_0$) theoretically attains a constant saturation value $I_S$. In the region of 100mv or so of reverse bias, the diode leakage current $I_0$ decreases with decreasing reverse bias reaching zero at zero reverse bias. The diode characteristic can be described as follows:

$$I_O = I_S \left[ \exp \cdot \frac{qV}{kT} - 1 \right] \qquad \text{eq. 3}$$

Where V is the voltage applied across the diode, taken as positive for forward bias, and $I_S$ is the reverse saturation current. If $qV/kT$ is small, equation 1 approximates to $$I_O \simeq I_S \cdot \frac{qV}{kT} \qquad \text{eq. 4}$$

The leakage current ($I_0$) is reduced to a fraction $qV/kT$ times the high voltage reverse bias value ($I_S$) when the reverse bias voltage is less than $kT/q$.

At room temperature $kT/q$ is equal to 0.026 volt and $I_0 \cong I_S (38.4)$ (V). For $V = -26$ millivolts, $I_0 \approx -I_S$. Clearly, if the reverse bias across the diode is reduced from tens of millivolts to millivolts, tenths of millivolts, or hundredths of millivolts, then the leakage current is correspondingly reduced.

It is, therefore, apparent from the foregoing that the circuit of FIG. 1 will have extremely low leakage currents, provided that the offset voltage across the inputs (which is also across diode D1) can be maintained below $kT/q$ (about 26m V at room temperature). The MOS input stage of an operational amplifier already in use (CA3130B) has guaranteed input offsets of 2 millivolts. This offset, due to mismatch of the input components, may be further decreased by nulling. Consequently, the remaining operational error between the input terminals can be made extremely small in amplifiers having extremely high $A_{OL}$. Since the difference between the inputs is a function of the $A_{OL}$ of the amplifier, the amplifier gain should be made high to reduce the input error term and therefore substantially reduce the input leakage current.

The output 34 of means 30 supplies the leakage current drawn by the parasitic diode path comprising diodes $D_{P1}$ and $D_{P2}$. Supplying this leakage from the amplifier output presents no problem since the output stage is normally capable of supplying large currents and the microamperes, or less, of current drawn by the leakage path do not materially affect the operation of the circuit.

Figure 3:
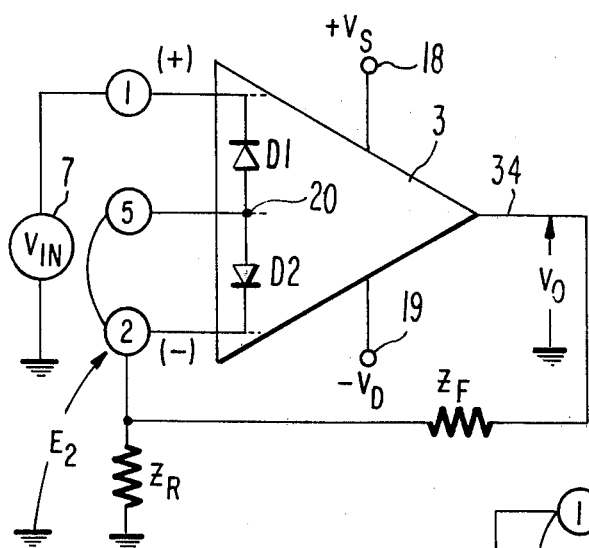
FIGS. 3 and 4 are partial schematic, partial block, diagrams of circuits embodying the invention.

The circuit of FIG. 3 is identical to that of FIG. 1 except that only a portion of the amplifier output is fed back to the input. The output 34 is connected via a feedback impedance $Z_F$ to terminal 2 and an impedance $Z_R$ is connected between terminal 2 and ground.

The relationship between $V_O$ and $V_{IN}$ for the noninverting amplifier is still as described for equation 1 above. Assume that $Z_F = Z_R$; B is the equal to 1/2. $V_0$ may then be expressed as follows:

$$\frac{V_O}{V_{IN}} = \frac{400,000}{200,001} = 1.99999$$

For $V_{IN} = 10v$, $V_0 = 19.9999$ volts.

The voltage $E_2$ at terminal 2 may then be expressed, in terms of $V_0$, as follows:

$$E_2 = V_{OUT} \times \frac{Z_R}{Z_R + Z_F}$$

For $V_0 = 19.9999$ $E_2 = 9.99995$

Since $V_{IN} = 10$ volts the difference or error voltage between input terminals 1 and 2 is 0.05 millivolts. As discussed above, for this extremely low value of reverse bias across diode D1 substantially no leakage current flows between node 20 and terminal 1 and from terminal 1 into the signal source.

Figure 4:
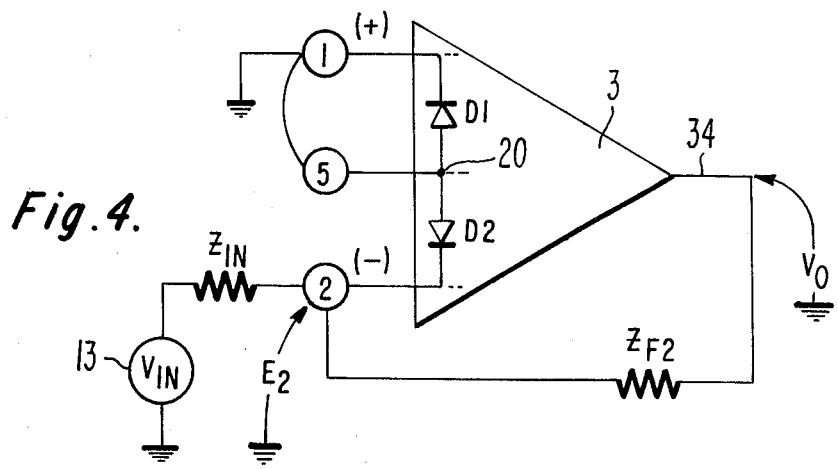

The amplifier 3 may also be operated in the inverting amplifier configuration as shown in FIG. 4. In this configuration, diode D1 is shorted by making a connection between bond pad 5 and input terminal 1 which is grounded. A current source is applied to terminal 2 which may be represented by a signal source 13 producing a signal $V_{IN}$ which is connected via impedance $Z_{IN}$ to input terminal 2. A feedback impedance $Z_{F2}$ is connected between output 34 and terminal 2. At the inverting ($-$) input 2 of the amplifier there exists a virtual ground. That is, the terminal is at ground potential even though there is no electrical connection between this nodal point and ground. The term virtual ground is used to imply that while the feedback serves to keep the voltage $E_2$ at, or near, zero volt, no current actually flows through this short.

For the inverting amplifier configuration, $E_2$ remains close to ground potential throughout the range of operation. Therefore, the cathode of diode D2 is held at, or near, ground potential and the anode of diode D2 is at ground potential due to the connection between bond pad 5 and ground terminal 1. The potential across diode D2 is therefore at, or near, 0 volt throughout the range of operation of the amplifier. With nearly zero volt across the diode, substantially no current will flow across the diode. In this configuration, the leakage current for the parasitic leakage path is supplied from ground potential via bonding pad 5 to region 20 and flows through diodes $D_{P2}$ and $D_{P1}$ into the $-V_D$ supply. But, clearly, substantially no leakage current flows through diode D2 into or from terminal 2 and from terminal 2 into or from the signal source (due to the amplifier).

The input impedance of the circuit thus approaches the extremely high value theoretically available when using IGFETs.

Short circuiting one of the diodes (D1, D2) connected between the gates of IGFETs 14 and 16 makes the protection asymmetrical but does not adversely affect the protection of the IGFETs as may be demonstrated by referring back to FIG. 1.

The potential ($V_{G14}$) at the gate of transistor 14 can go $V_F$ below and $V_R$ volts above the potential ($V_{G16}$) at the gate of transistor 16. $V_{G14}$ can go ($V_R + V_F$) volts above or below the potential ($V_{17}$) at region 17 as in the prior art. $V_{G16}$ is at the potential at node 20 ($V_{20}$) and the gate insulator of transistor 16 is protected by the leakage path of $D_{P1}$ and $D_{P2}$ which prevent voltage build up at the gate. Thus the electrostatic protection is as good as, or better than, that in the prior art circuit.

Figure 5:
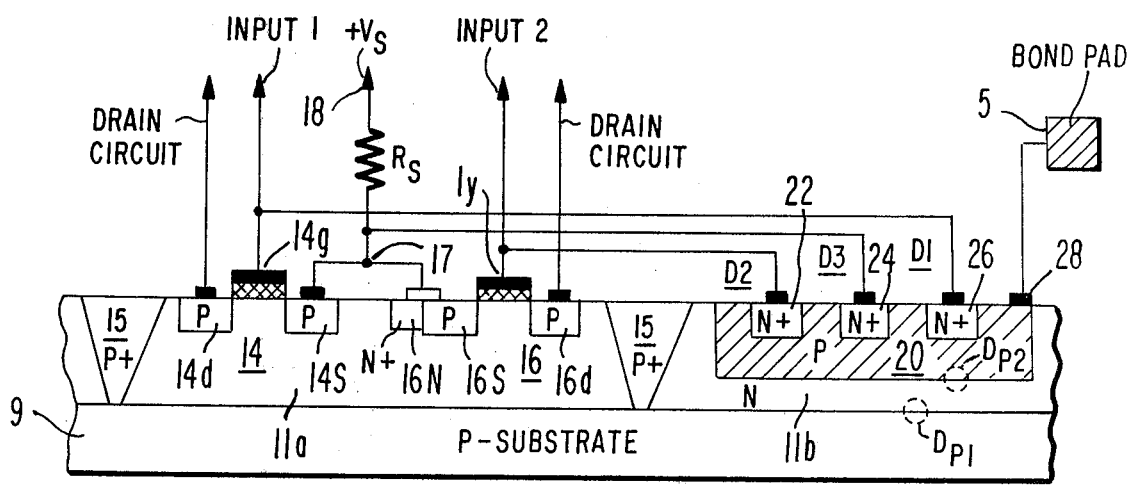
FIG. 5 is a drawing showing a partial cross section of an integrated circuit embodying the invention.

The input stage 10 and the protection circuit of amplifier 3 may be constructed as shown in FIG. 5 which includes a substrate 9 of P conductivity type on which is formed an epitaxial layer 11 of N conductivity type. Highly doped regions 15 of P conductivity type are diffused in the epitaxial layer for isolating portions 11a and 11b of the N layer from each other.

IGFET 14 is formed by diffusing spaced apart P conductivity regions 14s and 14d into portion 11a of the N layer. IGFET 16 is formed by diffusing spaced apart P-conductivity regions 16s and 16d into portion 11a.

Overlying the space between regions 14s and 14d and the space between regions 16s and 16d are oxide layers (shown cross-hatched) over which are formed gate electrodes 14g and 16g, respectively. Regions 14s and 16s, which are designed to be the source regions of transistors 14 and 16, respectively, are connected in common at node 17. It should be appreciated that, alternatively, the source regions of transistors 14 and 16 could be formed from a single P-region. Highly doped region 16N of N+ conductivity is diffused adjacent to regions 16s and an electrical contact common to regions 16s and 16N connects local substrate 11a to the sources 14s and 16s.

The protective network for transistors 14 and 16 includes region 20 of P-conductivity type diffused within region 11b. No metal connections need be made to region 11b. P-region 20 may be formed at the same time as, and may extend to the same depth as, the P-regions forming the sources and drains of transistors 14 and 16.

Three highly doped regions, 22, 24 and 26 of N+ conductivity type are diffused within region 20 for forming diodes D1, D2 and D3. Metal or other low impedance connections are made between region 22 and the gate 16g, between region 24 and the sources 14s and 16s, and between region 26 and the gate 14g. Regions 22, 24 and 26 function as the cathodes of diodes D2, D3 and D1, respectively, and region 20 functions as the anode of diodes D1, D2 and D3.

Parasitic diodes are present between region 20 and the substrate 9. Regions 9 and 11b form PN junction $D_{P1}$ where region 9 functions as the anode of the diode and region 11b functions as the cathode of the diode. Regions 11b and 20 form PN junction $D_{P2}$, where region 11b functions as the cathode of the diode and region 20 functions as the anode of the diode.

Regions 22, 24, and 26 are more heavily doped than region 20. But the latter is also highly doped relative to regions 11b and 9. Region 9 is the least heavily doped region. As a result, diode $D_{P1}$ is a relatively leaky diode having a low back impedance and a relatively high breakdown voltage. Diodes D1, D2 and D3 have low leakage, high back impedances and relatively low breakdwon voltages. In a typical circuit application the breakdown voltage ($V_R$) of diodes D1, D2 and D3 may be designed to be approximately 8 volts. Diodes D1, D2 and D3, while providing overvoltage protection to the circuit to which they are connected, also isolate to a great degree the leakage path, comprised of diodes $D_{P1}$ and $D_{P2}$, from the circuit which they protect. However, diodes D1 and D2, as discussed above, have finite back impedances and when reverse biased pass some leakage current.

To substantially reduce the leakage current a contact 28 of metal or other high conductivity material is formed on region 20 which is connected via a low impedance path to a bond pad 5. This permits the shorting out of diode D1 or D2 by making a connection between bond pad 5 and terminal 1 or terminal 2.

What is claimed is:

1. The combination comprising:
    a substrate of a semiconductor material of first conductivity type; a layer of semiconductor material of second conductivity type disposed on said substrate and forming a first PN junction therewith;
    first and second field effect transistors (FETs), each comprising first and second spaced apart regions of first conductivity type, defining the source and drain regions, respectively, disposed in said layer at a surface thereof, and a gate electrode overlying said surface between said first and second regions;
    means connecting said transistors in a differential configuration including means connecting the source regions of said first and second transistors to a common point;
    means protecting said first and second transistors against overvoltages applied between the gates of said transistors comprising: an additional region of first conductivity type disposed within said layer and forming a second PN junction therewith; two spaced apart regions of second conductivity type disposed within said additional region, each of said two spaced apart regions forming a PN junction with said additional region;
    means electrically connecting the gate electrode of said first transistor to one of said two regions, means electrically connecting the gate electrode of said second transistor to the second one of said two regions;
    an electrically conductive contact contacting said additional region; and
    means connecting said contact to one of said gate electrodes of said first and second field effect transistors for shorting out the PN junction connected to that gate.

2. The combination as claimed as claim 1 further including:
    amplifying means having an input and an output, said input being connected to at least one of the drains of said first and second field effect transistors;
    negative feedback means connected between the output of said amplifying means and said one of said gate electrodes to which said contact is connected; and
    means for applying a voltage signal source to the other one of said gate electrodes.

3. The combination as claimed in claim 1 further including:
    amplifying means having an input and an output, said input being connected to at least one of the drains of said first and second field effect transistors; negative feedback means connected between the output of said amplifying means and the other one of said gate electrodes; and means for applying a current signal source to said other one of said gate electrodes.

4. In combination with an amplifier having first aand second input terminals to which are connected the gates of first and second insulated gate field effect transistors (IGFETs) respectively, and wherein first and second rectifying junctions are connected back to back between said gates, the improvement comprising:
    means for applying an input signal to one of said first and second input terminals; and
    means for short circuiting the rectifying junction connected to the other one of said first and second terminals.

5. In the combination as claimed in claim 4 wherein a fixed reference potential is applied to said other one of said first and second input terminals.

6. The combination as claimed in claim 5 wherein said amplifier has an output for producing thereat an amplified signal $V_0$ which is equal to $A(V_1 - V_2)$ where A is the open loop gain of the amplifier, $V_1$ is the voltage applied to said first input terminal and $V_2$ is the voltage applied to said second input terminal;
    wherein said improvement further includes means coupling said output to said second input terminal for providing negative feedback between the output and the input of said amplifier; and wherein said one of said first and second input terminals is said first input terminal and said other one of said first and second terminals is said second terminal.

7. The combination as claimed in claim 5 wherein said other one of said first and second terminals is said first input terminal;

wherein said amplifier has an output for producing thereat an amplified signal $V_O$ which is equal to $A(V_1 - V_2)$ where A is the open loop gain of the amplifier, $V_1$ is the voltage applied to said first input terminal and $V_2$ is the voltage applied to said second input terminal; and wherein said one of said first and second input terminals is said second terminal.

8. A method for reducing the input offset error in an amplifier having a differential-input stage with inverting and non-inverting input terminals; said input stage including first and second insulated-gate field-effect transistors (IGFETs) each having a gate, a source and a drain electrode, the gate electrodes of said first and second IGFETs being connected to said inverting input terminal and to said non-inverting terminal, respectively, and the source electrodes being connected together at a first interconnection which is connected to a common terminal, and amplifying means having an input terminal to which at least one of the drain electrodes of said first and second transistors is connected, and having an output terminal, and a protective network including first and second PN junctions, each PN junction comprising a P region and an N region, wherein the same conductivity type region of said first and second PN junctions is connected at a second interconnection, the other region of said first PN junction is connected to said non-inverting input terminal, and the other region of said second PN junction is connected to said inverting input terminal; said method comprising the steps of:

a. completing a degenerative direct coupled feedback connection between said output terminal and an appropriate one of said inverting and non-inverting input terminals; and b. connecting an input signal source to one of said inverting and non-inverting input terminals; and c. connecting the other of said inverting and non-inverting terminals to said second interconnection with negligible impedance means.

* * * * *

UNITED STATES PATENT AND TRADEMARK OFFICE
CERTIFICATE OF CORRECTION

PATENT NO. : 4,044,313
DATED : August 23, 1977
INVENTOR(S) : Harold Allen Wittlinger et al It is certified that error appears in the above-identified patent and that said Letters Patent are hereby corrected as shown below:

Col. 1, line 9 "and" should be --- are ---.
line 61 "the" (second occurrence) should be --- that ---.

Col. 3, line 32 before "IGFET" insert --- the ---.

Col. 5, line 53 after "amplifier" insert --- configuration ---

Col. 7, line 43 "breakdwon" should be --- breakdown ---.

Col. 8, line 27 "as" (second occurrence) should be --- in ---.
line 47 "aand" should be --- and ---.

Signed and Sealed this

Third Day of January 1978

[SEAL]

Attest:

RUTH C. MASON
Attesting Officer

LUTRELLE F. PARKER
Acting Commissioner of Patents and Trademarks